United States Patent
Park et al.

(10) Patent No.: US 10,868,635 B2
(45) Date of Patent: Dec. 15, 2020

(54) CHANNEL ENCODING AND DECODING METHODS AND APPARATUSES USING ZERO BIT PADDING

(71) Applicant: SAMSUNG ELECTRONICS CO., LTD., Suwon-si (KR)

(72) Inventors: Jung-hyun Park, Hwaseong-si (KR); Nam-hyun Kim, Suwon-si (KR); Min-ho Kim, Hwaseong-si (KR); Joon-young Lee, Seoul (KR); Jin-joo Chung, Uiwang-si (KR); Doo-chan Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 72 days.

(21) Appl. No.: 16/021,769

(22) Filed: Jun. 28, 2018

(65) Prior Publication Data

US 2019/0068314 A1 Feb. 28, 2019

(30) Foreign Application Priority Data

Aug. 22, 2017 (KR) .................. 10-2017-0106245

(51) Int. Cl.
*H04L 1/00* (2006.01)
*H04L 5/00* (2006.01)
(Continued)

(52) U.S. Cl.
CPC ....... *H04L 1/0008* (2013.01); *H03M 13/1111* (2013.01); *H03M 13/2906* (2013.01); *H03M 13/356* (2013.01); *H03M 13/3723* (2013.01); *H03M 13/6356* (2013.01); *H04L 1/0041* (2013.01); *H04L 1/0045* (2013.01); *H04L 5/003* (2013.01); *H04L 5/0046* (2013.01); *H04L 27/2605* (2013.01); *H04L 5/0048* (2013.01)

(58) Field of Classification Search
None
See application file for complete search history.

(56) References Cited

U.S. PATENT DOCUMENTS

| 5,606,742 A * | 2/1997 | Kido ................... H04W 88/026 340/7.38 |
| 2007/0143655 A1* | 6/2007 | Niu .................... H03M 13/1102 714/752 |

(Continued)

FOREIGN PATENT DOCUMENTS

WO 2015080392 A1 6/2015

OTHER PUBLICATIONS

Burbank, et al. Wireless networking; understanding internetworking challenges. ISSN: 0887-3763. Copyright 2013 Chapter 4 (Year: 2013).*

(Continued)

*Primary Examiner* — Andre Tacdiran
(74) *Attorney, Agent, or Firm* — Sughrue Mion, PLLC

(57) ABSTRACT

Provided is a broadcast signal transmitting method including: generating a first bitstream including encoded data; generating a second bitstream by adding zero bits to the first bitstream, based on a difference between a modem data rate and a codec data rate; generating a third bitstream by encoding the second bitstream by using zero padding information about the zero bits; and transmitting a carrier signal generated by modulating the third bitstream.

11 Claims, 9 Drawing Sheets

(51) Int. Cl.
*H03M 13/29* (2006.01)
*H04L 27/26* (2006.01)
*H03M 13/00* (2006.01)
*H03M 13/11* (2006.01)
*H03M 13/37* (2006.01)
*H03M 13/35* (2006.01)

(56) References Cited

U.S. PATENT DOCUMENTS

| | | | |
|---|---|---|---|
| 2007/0143656 A1* | 6/2007 | Niu | H03M 13/618 |
| | | | 714/752 |
| 2010/0008385 A1* | 1/2010 | Noronha, Jr. | H04N 21/2389 |
| | | | 370/545 |
| 2010/0061448 A1 | 3/2010 | Zhou et al. | |
| 2010/0111107 A1* | 5/2010 | Han | H04L 1/0038 |
| | | | 370/472 |
| 2010/0199143 A1 | 8/2010 | Sanderovich | |
| 2011/0044271 A1* | 2/2011 | Hong | H04W 28/06 |
| | | | 370/329 |
| 2012/0250758 A1 | 10/2012 | Jou et al. | |
| 2013/0308954 A1* | 11/2013 | Lee | H03M 13/005 |
| | | | 398/118 |
| 2015/0078476 A1* | 3/2015 | Myung | H04L 1/0072 |
| | | | 375/295 |
| 2015/0082117 A1* | 3/2015 | Myung | H03M 13/2757 |
| | | | 714/758 |
| 2015/0082118 A1* | 3/2015 | Jeong | H03M 13/1165 |
| | | | 714/758 |
| 2015/0085951 A1* | 3/2015 | Shin | H04L 27/2627 |
| | | | 375/295 |
| 2015/0120284 A1* | 4/2015 | Son | G10L 21/003 |
| | | | 704/201 |
| 2015/0155967 A1* | 6/2015 | Kim | H04L 1/0042 |
| | | | 375/295 |
| 2016/0156370 A1* | 6/2016 | Ikegaya | H03M 13/2792 |
| | | | 714/776 |
| 2016/0241682 A1 | 8/2016 | Xu et al. | |
| 2017/0149527 A1 | 5/2017 | Myung et al. | |
| 2017/0149528 A1* | 5/2017 | Kim | H03M 13/256 |
| 2017/0187489 A1* | 6/2017 | Myung | H03M 13/1102 |
| 2017/0264320 A1* | 9/2017 | Lin | H03M 13/618 |
| 2018/0269899 A1* | 9/2018 | Noh | H04L 1/0061 |
| 2019/0393977 A1* | 12/2019 | Xin | H04L 1/0041 |

OTHER PUBLICATIONS

Search Report dated Nov. 19, 2018, issued by the International Searching Authority in counterpart International Patent Application No. PCT/KR2018/008178 (PCT/ISA/210).

Written Opinion dated Nov. 19, 2018, issued by the International Searching Authority in counterpart International Patent Application No. PCT/KR2018/008178 (PCT/ISA/237).

Anonymous, "ATSC Proposed Standard: Physical Layer Protocol (A/322)", Jun. 29, 2016, Advanced Television Systems Committee, ATSC S32-230r56, 260 pages total.

Communication dated Mar. 25, 2020 from the European Patent Office in application No. 18848818.3.

* cited by examiner

CHANNEL ENCODING AND DECODING METHODS AND APPARATUSES USING ZERO BIT PADDING

CROSS-REFERENCE TO THE RELATED APPLICATION(S)

This application is based on and claims priority under 35 U.S.C. § 119 to Korean Patent Application No. 10-2017-0106245, filed on Aug. 22, 2017, in the Korean Intellectual Property Office, the disclosure of which is incorporated by reference herein in its entirety.

BACKGROUND

1. Field

The disclosure relates to channel encoding and decoding, and more particularly, to channel encoding and decoding methods and apparatuses using zero bit padding.

2. Description of Related Art

A transmitter of a modem modulates a digital signal expressed in 0s and 1s into an analog signal having a periodic waveform. Then, the analog signal is transmitted to a receiver of a modem through a communication channel, and demodulated into a digital signal.

The modem determines a modem data rate transmittable according to a condition of the communication channel. Also, a codec receives the modem data rate from the modem, and determines a coding rate of the codec such that a codec data rate of the codec is lower than the modem data rate. As such, the modem data rate and the codec data rate are determined according to the condition of the communication channel.

When there is a difference between the modem data rate and the codec data rate, the codec may insert redundant zero bits into encoding data so as to adjust the codec data rate to be equal to the modem data rate. However, when the zero bits padded in the encoding data are channel-encoded or decoded without distinguishing the encoded data of the codec, the throughput required for channel encoding or decoding processes may increase due to the zero bits that do not contain information.

The present disclosure solves the above problems, and provides the following methods and apparatuses, as described below.

SUMMARY

Provided are broadcast signal transmitting methods and broadcast signal receiving methods for removing unnecessary throughput generated according to channel encoding and decoding of redundant zero bits.

Also, provided are broadcast signal transmitting apparatuses and broadcast signal receiving apparatuses respectively performing the broadcast signal transmitting methods and the broadcast signal receiving methods. Also, provided are non-transitory computer-readable recording media having recorded thereon programs which, when executed by a computer, performs the broadcast signal transmitting methods and the broadcast signal receiving methods.

Various aspects of the inventive concept will be set forth in part in the description which follows and, in part, will be apparent from the description, or may be learned by practice of the presented embodiments which are all exemplary.

In accordance with an aspect of the disclosure, a broadcast signal transmitting method includes: generating a first bitstream including encoded data; generating a second bitstream by adding zero bits to the first bitstream, based on a difference between a modem data rate and a codec data rate; generating a third bitstream by encoding the second bitstream by using zero padding information about the zero bits; and transmitting a carrier signal generated by modulating the third bitstream.

In accordance with another aspect of the disclosure, a broadcast signal receiving method includes: receiving a carrier signal; obtaining a third bitstream in which a second bitstream including encoded data and zero bits is channel-encoded, by demodulating the carrier signal; obtaining a second bitstream by channel-decoding the third bitstream, by using zero padding information about the zero bits; obtaining a first bitstream including the encoded data by removing the zero bits from the second bitstream; and extracting the encoded data from the first bitstream.

In accordance with another aspect of the disclosure, a broadcast signal transmitting apparatus includes: an data encoder configured to generate a first bitstream including encoded data; a zero bit padder configured to generate a second bitstream by adding zero bits to the first bitstream, based on a difference between a modem data rate and a codec data rate; a channel encoder configured to channel-encode the second bitstream by using zero padding information about the zero bits to generate a third bitstream; and a modulator configured to transmit a carrier signal generated by modulating the third bitstream.

In accordance with another aspect of the disclosure, a broadcast signal receiving apparatus includes: a demodulator configured to receive a carrier signal, and demodulate the carrier signal to obtain a third bitstream in which a second bitstream including encoded data and zero bits is channel-encoded; a channel decoder configured to channel-decode the third bitstream to obtain a second bitstream, by using zero padding information about the zero bits, and remove the zero bits from the second bitstream to obtain a first bitstream including the encoded data; and an data decoder configured to extract the encoded data from the first bitstream.

In accordance with another aspect of the disclosure, there are provided a non-transitory computer-readable recording medium having recorded thereon a program which, when executed by a computer, performs the broadcast signal transmitting method, and a non-transitory computer-readable recording medium having recorded thereon a program which, when executed by a computer, performs the broadcast signal receiving method.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
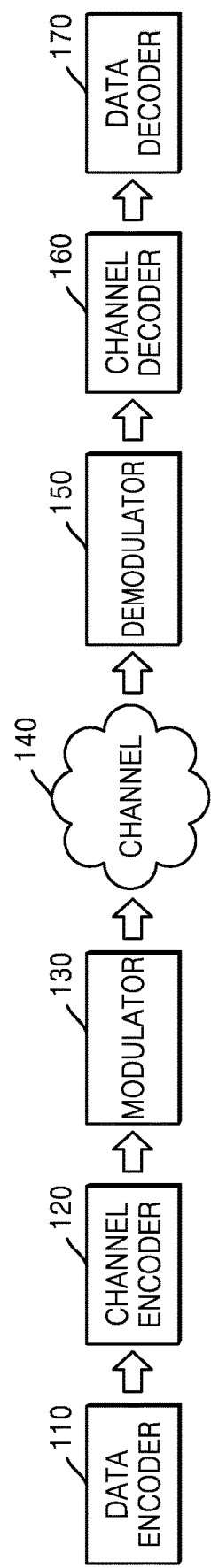
FIG. 1 is a flow diagram of a broadcast signal transmitting and receiving system.

At least one of the components, elements, modules or units (collectively "components" in this paragraph) represented by a block in the drawings may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the embodiments may be implemented in algorithms that execute on one or more processors. Furthermore, the components represented by a block or processing steps may employ any number of related art techniques for electronics configuration, signal processing and/or control, data processing and the like.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. Expressions such as "at least one of," when preceding a list of elements, modify the entire list of elements and do not modify the individual elements of the list.

All terms including descriptive or technical terms which are used herein should be construed as having meanings that are obvious to one of ordinary skill in the art. However, the terms may have different meanings according to an intention of one of ordinary skill in the art, precedent cases, or the appearance of new technologies. Also, some terms may be arbitrarily selected by the applicant, and in this case, the meaning of the selected terms will be described in detail in the detailed description of the disclosure. Thus, the terms used herein have to be defined based on the meaning of the terms together with the description throughout the specification.

Data transmitting and receiving methods and apparatuses according to embodiments of the present disclosure are related to channel-encoding and channel-decoding of data by using zero padding information about zero bits added to adjust a codec data rate.

Hereinafter, exemplary embodiments will be described in detail with reference to accompanying drawings.

FIG. 1 is a flow diagram of a broadcast signal transmitting and receiving system.

Referring to FIG. 1, the broadcast signal transmitting and receiving system according to an embodiment includes a data encoder 110, a channel encoder 120, a modulator 130, a channel 140, a demodulator 150, a channel decoder 160, and a data decoder 170. The data encoder 110, the channel encoder 120, and the modulator 130 may be included in a broadcast signal transmitting apparatus (not shown), and the demodulator 150, the channel decoder 160, and the data decoder 170 may be included in a broadcast signal receiving apparatus (not shown). Hereinafter, functions of each component will be described.

The data encoder 110 generates a broadcast signal frame in a bitstream form by multiplexing core layer data and enhanced layer data. For example, the data encoder 110 combines a core layer signal corresponding to the core layer data and an enhanced layer signal corresponding to the enhanced layer data in different power levels, and generates a multiplexed signal by performing interleaving applied to the core layer signal and the enhanced layer signal. Here, the data encoder 110 may generate the broadcast signal frame including a bootstrap and a preamble by using a time-interleaved signal. Here, the broadcast signal frame may be ATSC 3.0 frame or ATSC 3.X frame. A structure of the broadcast signal frame will be described in detail with reference to FIG. 2.

According to an embodiment, the data encoder 110 may not combine two layer signals, but may interleave one layer signal and generate a broadcast signal frame.

The channel encoder 120 performs channel encoding for error correction on the broadcast signal frame in a bitstream form, the broadcast signal frame generated by the data encoder 110. According to an embodiment, the channel encoder 120 may divide the broadcast signal frame into pieces of data according to encoding block lengths, generate parities by using the pieces of data, generate a plurality of encoding blocks in which the pieces of data and the parities are paired up, and output a code block including the plurality of encoding blocks.

Accordingly, the channel encoder 120 outputs a plurality of packets encoded according to an error correction encoding method in code blocks. The output code blocks are input to the modulator 130. The error correction encoding method according to an embodiment may be based on forward error correction (FEC).

The channel encoder 120 may transmit a modem data rate obtained from the modulator 130 to the data encoder 110. Also, the data encoder 110 may determine an encoding rate of data according to the modem data rate. For example, the data encoder 110 may determine the encoding rate of data such that a codec data rate is equal to or lower than the modem data rate.

When the codec data rate is lower than the modem data rate, the data encoder 110 may increase the codec data rate to be equal to the modem data rate by adding redundant zero bits to an output bitstream. Positions of a bitstream where zero bits are added may be pre-determined according to encoding standards.

Reasons why zero bits are added to an output bitstream of the data encoder 110 will be described below with reference to FIGS. 3 and 4.

The data encoder 110 may add zero bits to an encoded bitstream such that output bitstreams are uniform. A difference between a modem data rate and a codec data rate may be uniformly maintained for a certain period of time. Accordingly, a certain number of zero bits may be inserted into bitstreams transmitted for the certain period of time so as to reduce a size of zero padding information indicating the number of inserted zero bits. For example, when the numbers of zero bits of a plurality of bitstreams are uniform, zero padding information may correspond to the plurality of bitstreams. Accordingly, the size of zero padding information may be low as the zero padding information is generated at once during the certain period of time.

The data encoder 110 may uniformly add zero bits to bitstreams included in broadcast signal frames transmitted for a certain period of time. For example, the data encoder 110 may add the same amount of zero bits to each of a plurality of broadcast signal frames transmitted for 10 ms.

Also, the data encoder 110 may add the same amount of zero bits to a plurality of sub-bitstreams included in a bitstream corresponding to a broadcast signal frame. For example, when five channel encoders are used. A broadcast signal frame may be split into five bitstreams to be channel-encoded. Accordingly, the data encoder 110 may insert the same amount of zero bits to bitstreams split from a broadcast signal frame, according to the number of channel encoders.

When zero bits are added to a bitstream, the data encoder 110 may generate zero padding information about the zero bits. Then, the data encoder 110 may add the zero padding information to a preamble of a broadcast signal frame in a bitstream form. Accordingly, the zero padding information may be transmitted to the channel encoder 120 after being inserted into the preamble of the broadcast signal frame.

Zero padding information may include information about the number and positions of zero bits. Accordingly, the channel encoder 120 may channel-encode a bitstream of the data encoder 110 by considering the number and positions of zero bits according to zero padding information. A channel encoding method according to zero padding information will be described in detail later with reference to FIG. 5.

The data encoder 110 may scramble a bitstream including zero bits. The scrambling may include an operation of randomizing a data pattern. For example, the same bits are prevented from being consecutively provided in a bitstream via scrambling, and thus the number of bit transitions is appropriately maintained. Accordingly, a spectrum of signal in a channel bandwidth is widely spread, and thus, a receiver of a modem may maintain an optimum condition.

The data encoder 110 may scramble a bitstream according to zero padding information. The bitstream may be scrambled by one scrambler, but according to an embodiment, may be scrambled by two scramblers. For example, a portion corresponding to encoded data may be scrambled by a first scrambler, and a portion corresponding to zero bits may be scrambled by a second scrambler. A scrambling method of a bitstream to which zero bits are added will be described later with reference to FIG. 6.

The channel encoder 120 may generate a parity bit for correcting an error of a broadcast signal frame. The channel encoder 120 may add a plurality of parity bits stated by a low-density parity check (LDPC) code to a bitstream of a broadcast signal frame. Each parity bit is set to satisfy the LDPC code.

LDPC codes may be indicated by a bipartite graph referred to as a Tanner graph. According to the Tanner graph, an edge may connect a variable node only to a check node. Accordingly, a variable node is unable to be connected to another variable node, or a check node is unable to be connected to another check node. In the Tanner graph, variable nodes correspond to bits of encoded data, and contract nodes referred to as check nodes correspond to one set of parity check constraints defining the LDPC codes. The parity bit is used to determine, during a channel decoding process, whether encoded data is damaged during channel transmission.

The modulator 130 modulates an output bitstream of the channel encoder 120 to a signal capable of passing the channel 140.

The modulator 130 may generate channel condition information, based on a condition of the channel 140, and transmit the channel condition information to the channel encoder 120. Also, the channel encoder 120 may determine a modem data rate according to the channel condition information. Also, the channel encoder 120 may determine the modem data rate to have a uniform value per time interval.

Through a series of operations of each component described above, the broadcast signal transmitting apparatus according to an embodiment transmits a channel-encoded broadcast signal frame through the channel 140 by using an orthogonal frequency division multiplex (OFDM) communication method. The channel-encoded broadcast signal frame is received through an antenna of the broadcast signal receiving apparatus. The broadcast signal receiving apparatus may receive the channel-encoded broadcast signal frame via synchronization, channel estimation, and equalization processes.

The demodulator detects and demodulates a bootstrap from the channel-encoded broadcast signal frame, demodulates a preamble by using information included in the bootstrap, and demodulates a data payload by using information included in the preamble. Here, the data payload may be a payload in which at least two pieces of layer data are combined.

The channel decoder 160 performs channel-decoding on the bootstrap, the preamble, and the data payload. An error may be generated when the broadcast signal frame passes the channel 140. Accordingly, the channel decoder 160 performs a parity check for correcting an error of the broadcast signal frame in a bitstream form. The channel decoder 160 extracts a parity bit from a bitstream obtained from the demodulator 150 and determine whether data of the bitstream matches the parity bit, according to an LDPC code. The channel decoder 160 updates a variable node and a constraint node until the error is corrected, and restores the bitstream before being channel-encoded by the channel encoder 120.

The channel decoder 160 may convert a log likelihood ratio (LLR) value at a certain position from among LLR values obtained by the demodulator 150 according to the zero padding information. An LLR value demodulated by the demodulator 150 is consecutive analog signal, rather than a digital signal expressed in bits. Accordingly, the LLR value needs to be converted to a digital signal expressed in bits. When a result of converting the LLR value at the certain position is predictable, the LLR value at the certain position may be forcibly changed such that a bit value according to the LLR value at the certain position matches the predicted value.

For example, since zero bits are positioned at pre-determined portions in a bitstream, a bit value at a certain position in the bitstream may be predicted to be 0, based on the number of zero bits. Accordingly, a certain LLR value may be changed according to the number of zero bits indicated by zero padding information, such that a bit value of a certain position in the bitstream is determined to be 0.

Details about a channel decoding process according to an LDPC code will be described later with reference to FIGS. 7 through 10.

The data decoder 170 reconstructs core layer data from a signal decoded by the channel decoder 160, and reconstructs enhanced layer data via cancellation corresponding to the restored core layer data. Here, the data decoder 170 may first generate a broadcast signal frame, restore a bootstrap from the broadcast signal frame, restore a preamble by using information included in the bootstrap, and then use signaling information included in the preamble. Here, the signaling information may include L1 signaling information, and may include injection level information, normalizing information, etc.

The data decoder 170 may descramble a channel-decoded bitstream. A descrambling method may be the reverse of a scrambling method of the data encoder 110. For example, when an entire bitstream is scrambled by one scrambler, the entire bitstream is descrambled by one descrambler. When an encoded data portion and a zero bit portion of a bitstream are scrambled by two different scramblers, the encoded data portion and the zero bit portion of the bitstream are descrambled by two descramblers corresponding to the two scramblers.

The data decoder 170 may remove, from the output bitstream of the channel decoder 160, the zero bits which are added by the data encoder 110 to match the codec data rate and the modem data rate.

Figure 2:
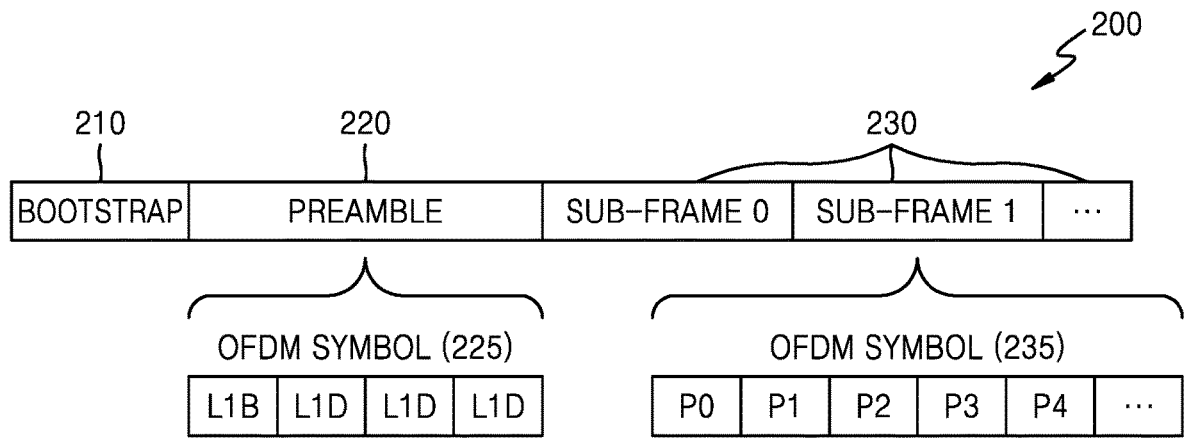
FIG. 2 is a diagram of a structure of a broadcast signal frame.

FIG. 2 is a diagram of a structure of a broadcast signal frame 200.

The broadcast signal frame 200 of FIG. 2 may be, for example, a broadcast signal frame according to ATSC 3.0 Standard or ATSC 3.X Standard.

Referring to FIG. 2, the broadcast signal frame 200 according to an embodiment may include a bootstrap 210, a preamble 220, and sub-frames 230 corresponding to data symbols.

The preamble 220 according to an embodiment may include signaling information including zero padding information indicating the number of zero bits. In FIG. 2, the preamble 220 may include OFDM symbols 225, such as L1-basic (L1B) and L1-detail (L1D).

Here, L1B may be fixed length signaling information. For example, L1B may correspond to 200 bits. Also, L1D may be variable length signaling information. For example, L1D may correspond to 200 to 2352 bits.

The broadcast signal frame 200 starts with the bootstrap 210 including system version information and general signaling information, followed by L1B and L1D. L1B may be used to transmit general signaling information, such as the number of physical layer pipes (PLPs), a fast Fourier transform (FFT) size, a guard interval, and modulation/code rate information for L1D, via a uniform bit number, while L1D may be used to transmit remaining signaling information. Here, a bit number of L1D may vary according to the number of PDPs being transmitted.

The bootstrap 210 may signal a bit-interleaved coded modulation (BICM) mode and an OFDM parameter of L1B, and L1B may signal a BICM mode and an OFDM parameter of L1B. Here, a BICM mode may include constellation and an encoding rate, and an OFDM parameter may include an FFT size, a guard interval length, and a pilot pattern.

Figure 3:
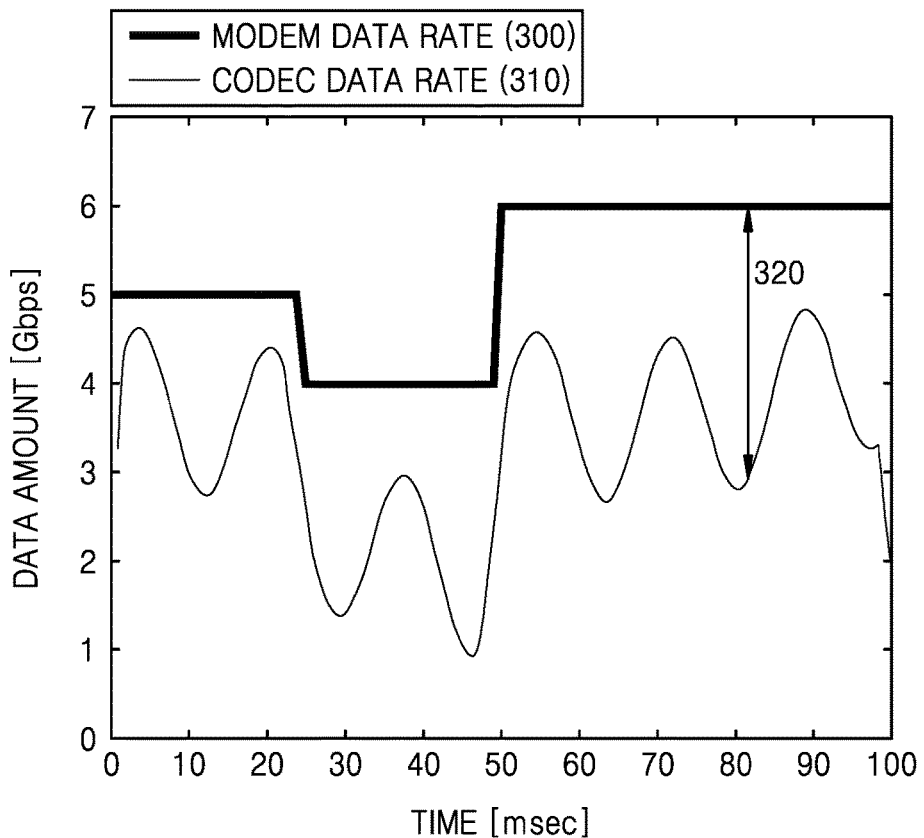
FIGS. 3 and 4 are diagrams for describing reasons why zero bits are added according to a relationship between a modem data rate and a codec data rate.
Figure 4:
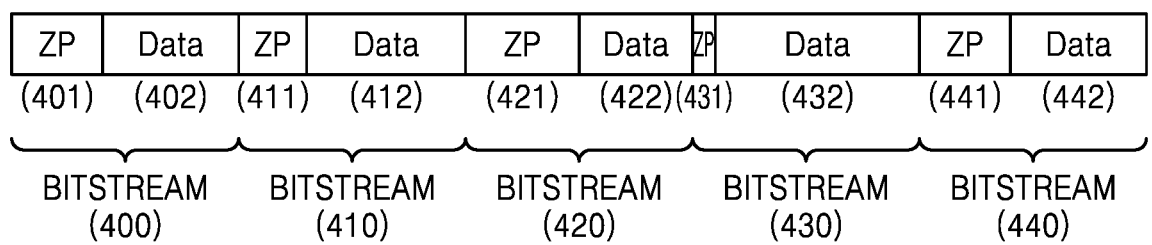

FIGS. 3 and 4 are diagrams for describing reasons why zero bits are added according to a relationship between a modem data rate and a codec data rate.

FIG. 3 is a graph for describing a relationship between a modem data rate 300 and a codec data rate 310. The graph of FIG. 3 shows changes of the modem data rate 300 and the codec data rate 310 according to time. An x-axis indicates time in units of microseconds, and a y-axis indicates sizes of the modem data rate 300 and codec data rate 310.

The modem data rate 300 is determined to be a uniform value according to a channel condition updated per certain time. Accordingly, the modem data rate 300 of FIG. 3 is in a form of square waves. However, the codec data rate 310 may irregularly fluctuate according to characteristics of data being encoded.

Since a fluctuating range of the codec data rate 310 is wide, an encoding rate of a data encoder is determined such that a largest value of the codec data rate 310 is lower than the modem data rate 300. Accordingly, as shown in FIG. 3, the codec data rate 310 is set to be always lower than the modem data rate 300, thereby preventing overflow of data.

However, due to a difference 320 between the modem data rate 300 and the codec data rate 310, underflow of data may occur. When the underflow occurs, an amount of data smaller than an estimated amount of data to be received by a receiver modem is transmitted to the receiver modem. As a result, due to an absence of transmitted data, connection between modems may be disconnected.

Accordingly, in order to prevent the underflow, a data encoder inserts zero bits to an image signal frame represented in a bitstream. The amount of zero bits being inserted is determined by an amount of bits according to the difference 320. Accordingly, since the codec data rate 310 increases according to the insertion of zero bits, the underflow of data does not occur. Consequently, by inserting the zero bits, the size of a bitstream transmitted per unit time may be constant according to the modem data rate 300, as shown in FIG. 4.

FIG. 4 illustrates bitstreams 400 through 440 including zero bits. The five bitstreams 400 through 440 of FIG. 4 have uniform sizes. Also, the bitstreams 400 through 440 respectively include zero bits 401 through 441 to make the sizes of the bitstreams 400 through 440 the same. Accordingly, even when sizes of pieces of encoded data 402 through 442 respectively included in the bitstreams 400 through 440 are not the same, the zero bits 401 through 441 may be inserted to make the sizes of the bitstreams 400 through 440 the same.

Since zero bits equal to a difference between a modem data rate and a codec data rate are added to a bitstream as in FIG. 4, overflow or underflow of data transmitted from a modem is not generated. Accordingly, problems caused by a difference between the modem data rate 300 and the codec data rate 310 of FIG. 3 may be solved.

Figure 5:
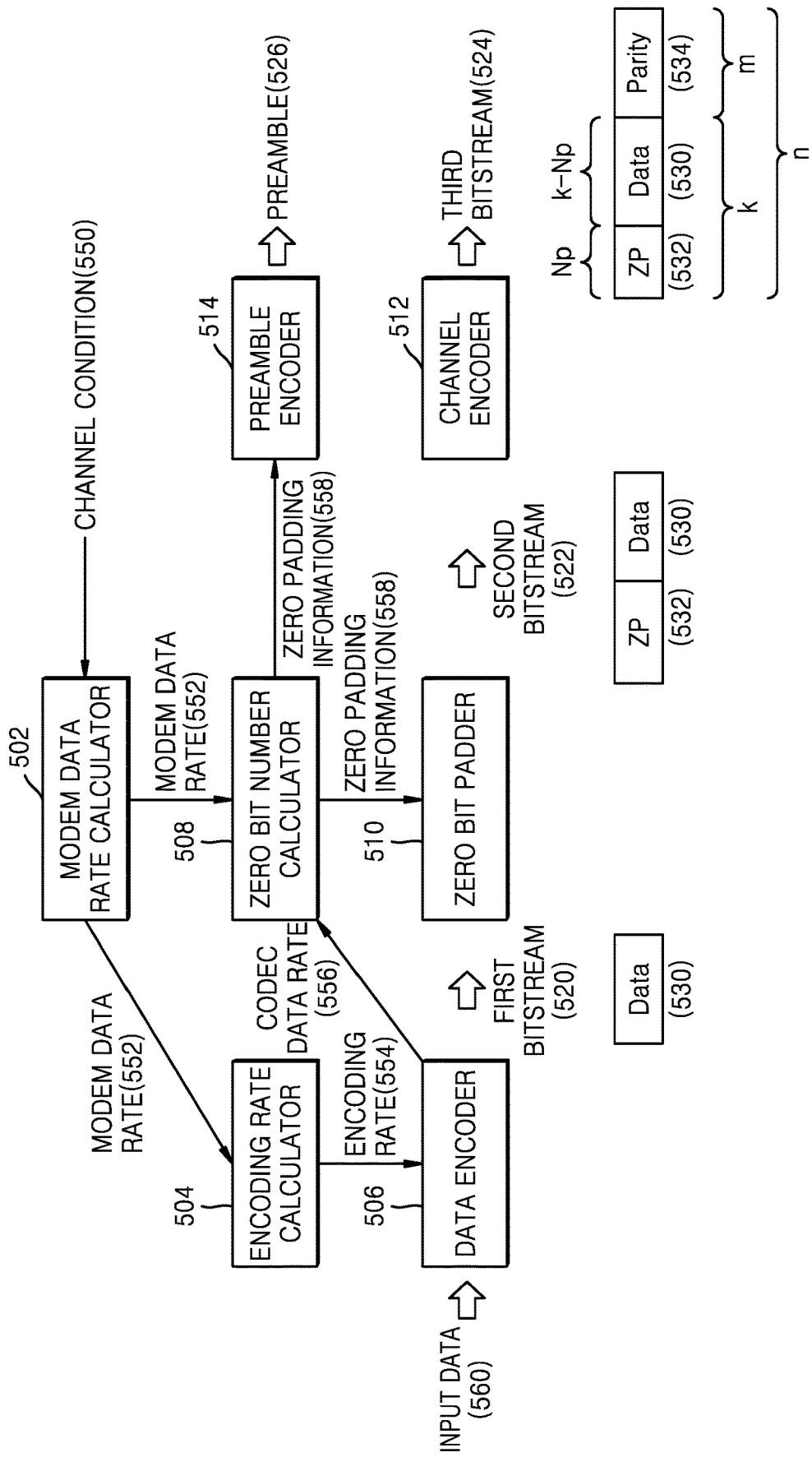
FIG. 5 is a flow diagram of a broadcast signal transmitting apparatus using zero padding information, according to an embodiment.

FIG. 5 is a flow diagram of a broadcast signal transmitting apparatus using zero padding information, according to an embodiment.

A modem data rate calculator 502 calculates a modem data rate 552, based on a channel condition 550. Also, an encoding rate calculator 504 calculates an encoding rate 554, based on the modem data rate 552.

A data encoder 506 encodes input data 560 according to the encoding rate 554. Also, the data encoder 506 outputs a first bitstream 520 including encoded data 530 according to an encoding result.

A zero bit number calculator 508 obtains the modem data rate 552 from the modem data rate calculator 502, and obtain a codec data rate 556 indicating an output data rate of the first bitstream 520, from the data encoder 506. Also, the zero bit number calculator 508 calculates the number of zero bits, based on a difference between the modem data rate 552 and the codec data rate 556. The number of zero bits is included in zero padding information 558.

A zero bit padder 510 outputs a second bitstream 522 including the encoded data 530 and zero bits 532 by adding the zero bits 532 to the first bitstream 520 according to the zero padding information 558. A bit number of the second bitstream 522 is defined to be k.

A channel encoder 512 outputs a third bitstream 524, in which parity information 534 for a parity check of data of the second bitstream 522 is added to the second bitstream 522. The channel encoder 512 may refer to information about the zero bits 532 while generating the parity information 534. A bit number of the third bitstream 524 may be defined to be n.

When the second bitstream 522 is channel-encoded by the channel encoder 512 without the encoded data 530 and the zero bits 532 being distinguished, a channel encoding rate is k/n. On the other hand, when the second bitstream 522 is channel-encoded by the channel encoder 512 after the encoded data 530 and the zero bits 532 are distinguished, an effective channel encoding rate is (k−Np)/n. Accordingly, when the encoded data 530 and the zero bits 532 are distinguished, an effective channel encoding rate for obtaining the encoded data 530 decreases. Accordingly, an amount of operation resources required during channel encoding and decoding processes is decreased, and thus channel encoding and decoding efficiency is increased.

In order for information about the zero bits 532 to be referred to during the channel decoding process, a preamble encoder 514 encodes information about the number of zero bits. Then, the preamble encoder 514 adds the zero padding information 558 including the encoded information about the number of zero bits to a preamble 526 of an image signal frame. The zero padding information 558 added to the preamble 526 may be used to reconstruct data received by a broadcast signal receiving apparatus.

Figure 6:
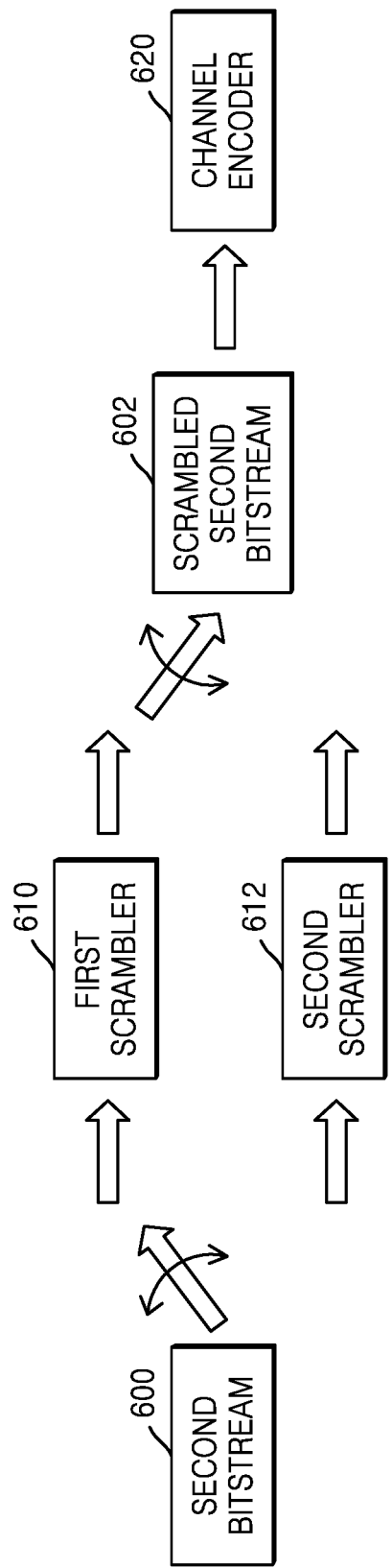
FIG. 6 is a flow diagram for describing a scrambling method of a bitstream to which zero bits are added.

FIG. 6 is a flow diagram for describing a scrambling method of a bitstream to which zero bits are added.

When one scrambler is used, encoded data that is practically meaningful is scrambled together with zero bits. Thus, when only one scrambler is used, it is difficult to distinguish the zero bits and the encoded data before the encoded data is descrambled during a decoding process. Also, since the zero bits are repeatedly provided at certain locations, when the zero bits are scrambled separately from the encoded data, scrambling and descrambling may be efficiently performed.

A second bitstream 600 including encoded data and zero bits is scrambled by a first scrambler 610 and a second scrambler 612 of a broadcast signal receiving apparatus. A portion of the second bitstream 600, which corresponds to the encoded data is scrambled by the first scrambler 610. Also, a portion of the second bitstream 600, which corresponds to the zero bits, is scrambled by the second scrambler 612. During an encoding process, each of the first and second scramblers 610 and 612 may be initialized for a new bitstream.

A channel encoder 620 channel-encodes a scrambled second bitstream 602. Thus, parity information about the scrambled second bitstream 602 is generated.

A broadcast signal receiving apparatus performs descrambling by performing the scrambling method of FIG. 6 in a reverse. A channel-decoded bitstream is descrambled by a first descrambler and a second descrambler. According to zero bit padding information, a portion determined to be encoded data is descrambled by the first descrambler, and a portion determined to be zero bits is descrambled by the second descrambler. Also, data is reconstructed by decoding the descrambled bitstream.

LDPC according to an LDPC code will be described with reference to FIGS. 7 through 9.

A parity bit is determined according to an error correcting code, and includes m bits. The parity bit may be an LDPC code for LDPC. The LDPC code has an error correction capability closest to a channel capacity limit presented by Shannon, together with turbo encoding, from among FEC technologies. An LDPC decoding process is performed by using a parity check matrix H and a Tanner graph, wherein the parity check matrix H is expressed by the Tanner graph. The same number of check nodes as the number of columns in a parity check matrix is provided, and the same number of variable nodes as the number of rows is provided to form a Tanner graph. When an (i, j) element of a matrix is 1, an $i^{th}$ check node is connected to a $j^{th}$ variable node via an edge to be neighboring nodes.

Figures 7, 8:
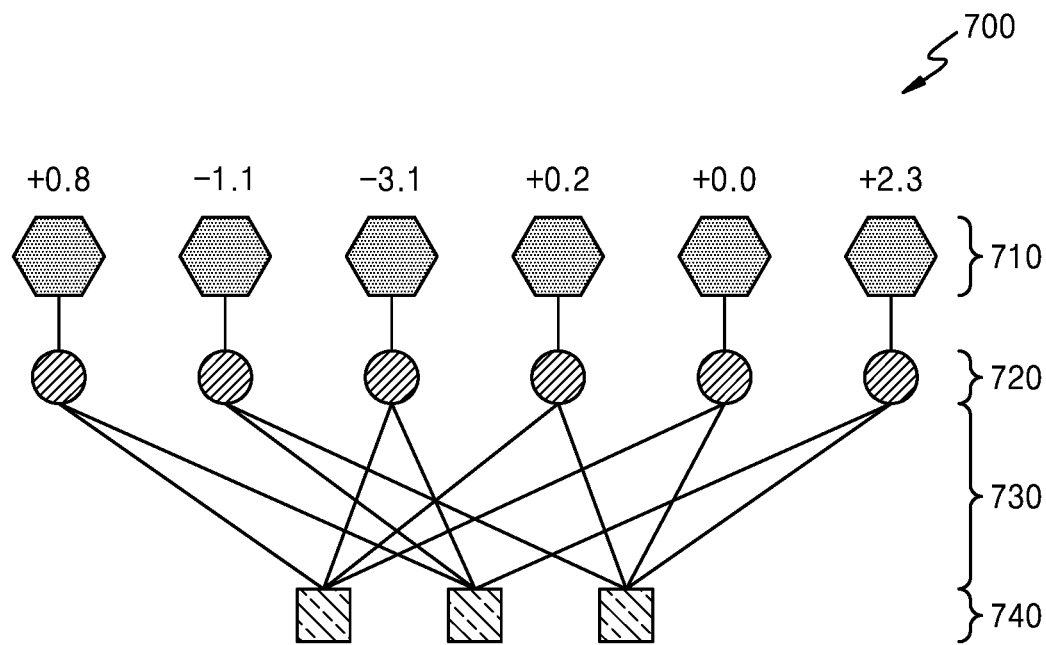
FIG. 7 is a diagram of a Tanner graph of channel decoding.
FIG. 8 is a diagram of a low density parity-check (LDPC) code corresponding to the Tanner graph of FIG. 7.

FIG. 7 is a diagram of a Tanner graph of channel decoding.

LDPC codes are codes in which their values are capable of satisfying LDPC constraints. Generally, the parity check constraints may be defined by a graph including a plurality of variable nodes and a plurality of check nodes, which may have code values.

Referring to FIG. 7, LDPC codes may be illustrated by bipartite graphs referred to as a Tanner graph 700.

In the Tanner graph 700, LLR values 710 respectively corresponding bits included in a bitstream are input to variable nodes 720, and check nodes 740 in nodes of another set may correspond to a parity-check constraint set defining a code.

In the Tanner graph 700, edges 730 may connect the variable nodes 720 to the check nodes 740. When the variable nodes 720 and the check nodes 740 are neighboring nodes when they are connected via the edges 730 in the Tanner graph 700. A parity check may be represented by a matrix including rows indicating the check nodes 740 and columns indicating the variable nodes 720, wherein a value of 1 may indicate a link between nodes and a value of 0 may indicate that a link does not exist. The LDPC codes may be equivalently represented by using an LDPC matrix.

FIG. 8 is a diagram of a LDPC code corresponding to the Tanner graph 700 of FIG. 7.

Referring to FIG. 8, the LDPC code may be represented as a LDPC matrix H 810. Here, when the LDPC matrix H 810 and a vector X 820 establish a relationship of Hx=0, it is determined that the vector X 820 does not have an error.

For example, when a channel encoding apparatus transmits a codeword c in which a source message and a parity check bit are combined, a relationship between a LDPC matrix H and the codeword c may be as Equation 1, $$Hc=0 \quad \text{[Equation 1]}$$

Here, H denotes a LDPC matrix and c denotes a codeword in which a source message and a parity check bit are combined.

Meanwhile, when the channel encoding apparatus transmitted the codeword c, a noise component n may be added through a channel, and a channel decoding apparatus may receive a signal r having noise.

$$r+c+n \quad \text{[Equation 2]}$$

Meanwhile, the channel decoding apparatus performs an operation using a LDPC matrix so as to obtain the codeword c, further a source message s, from the received signal r. In other words, since Hc=0, Equation 3 may be established.

$$Hr=Hc+Hn=Hn \quad \text{[Equation 3]}$$

Meanwhile, the received signal r may be a digital signal of 0 and 1, or a fraction between 0 and 1.

When a fraction between 0 and 1 is received via the LDPC matrix, the channel decoding apparatus may select a suitable value by using a probability of being 0 or 1.

The received signal r may be used to indicate an input probability in a variable node of a bipartite graph. Also, a bit probability message may be transmitted from the variable node to a check node, and is added to the variable node according to a parity check constraint. An LLR value L(r) may be defined as Equation 4.

$$L(r) = \log\left(\frac{P(r=0)}{P(r=1)}\right) \quad \text{[Equation 4]}$$

The LDPC code used during a channel decoding process may be a macro-matrix indicating a block row and a block column of an LDPC matrix. In other words, a 0 entry of the macro-matrix may correspond to a partial matrix of Z×Z.

Meanwhile, Equations 5 through 9 may be used as a method of repetitive decoding for updating a probability value with respect to an input node.

$$L(q_{mj})=L(q_j)-R_{mj} \quad \text{[Equation 5]}$$

Equation 5 may indicate an LLR value per row with respect to a column j of a row m of a checksum subset. In other words, $L(q_{mj})$ of Equation 5 may indicate an LLR value with respect to a variable node. Here, $R_{mj}$ indicates a value of check node, and $L(q_j)$ indicates a value of the variable node.

$$A_{mj} = \sum_{\substack{n \in N(m) \\ n \neq j}} \Psi(L(q_{mn})) \quad \text{[Equation 6]}$$

In Equation 6, $A_{mj}$ indicates a size of the check node calculated based on the LLR value $L(q_{mn})$.

$$s_{mj} = \prod_{\substack{n \in N(m) \\ n \neq j}} \text{Sign}(L(q_{mn})) \quad \text{[Equation 7]}$$

In Equation 7, $s_{mj}$ indicates a sign of the check node calculated based on the LLR value $L(q_{mn})$.

$$R_{mj}=-s_{mj}\Psi(A_{mj}) \quad \text{[Equation 8]}$$

In Equation 8, $R_{mj}$ indicates an updated value of the check node calculated based on the size $A_{mj}$ and the sign $s_{mj}$ of the check node.

$$L(q_j)=L(q_{mj})+R_{mj} \quad \text{[Equation 9]}$$

In Equation 9, $L(q_j)$ indicates an updated value of the variable node calculated based on the updated value $R_{mj}$ and the LLR value $L(q_{mj})$. Here, a value of the variable node may be updated with respect to the column j.

Meanwhile, when decoding is performed according to Equations 5 through 9, existence of an error may be determined according to Equation 10.

$$Hr=0 \quad \text{[Equation 10]}$$

In other words, when Hr=0, it is considered that suitable decoding has been performed, and thus it is determined that a decoding cease condition is satisfied. When it is determined that the decoding cease condition is not satisfied, the check node and the variable node may be updated again.

Meanwhile, when the decoding cease condition is not satisfied as above, the check node and the variable node are continuously updated until the decoding cease condition is satisfied, and in this case, a throughput may be too high. Channel decoding methods and apparatuses according to embodiments may reduce a required throughput according to zero padding information.

Figure 9:
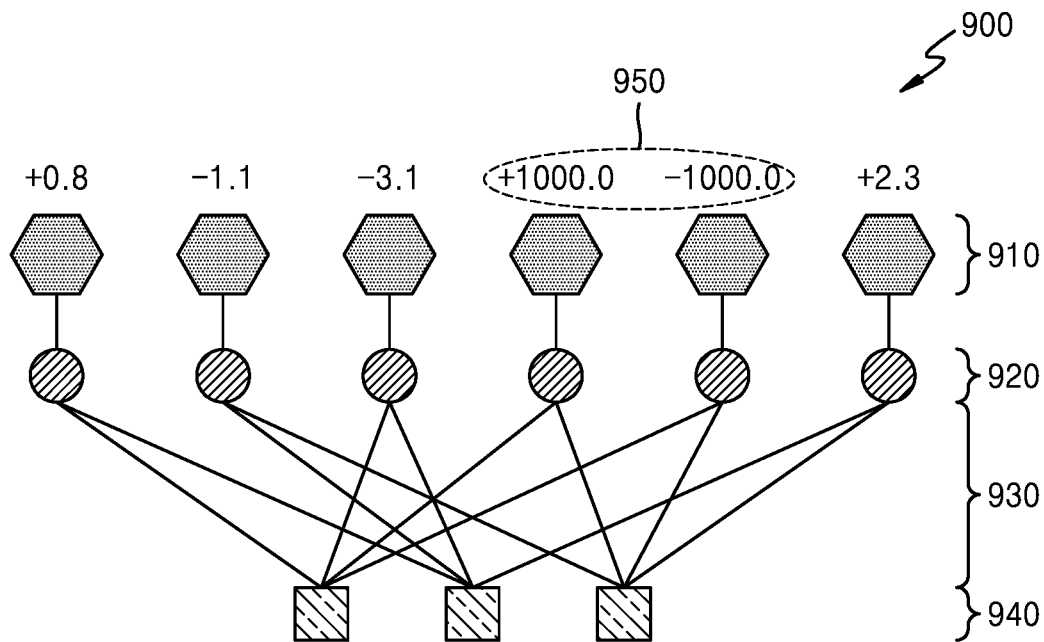
FIG. 9 is a diagram of a Tanner graph for describing a method of performing channel decoding by using zero padding information of a preamble, according to an embodiment.

FIG. 9 is a diagram of a Tanner graph 900 for describing a method of performing channel decoding by using zero padding information of a preamble, according to an embodiment.

Referring to FIG. 9, the Tanner graph 900 including variable nodes 920 input which LLR values 910 corresponding to bits of a bitstream are input, check nodes 940, and edges 930 connecting the variable nodes 920 and the check nodes 940 is illustrated.

In LDPC decoding, LLR values of bits to be decoded are "soft" data like analog probability. In other words, reliability of the bits may be determined through the LLR values. However, a decoding error may be generated when the LLR value is inaccurate. For example, some bits may strongly indicate one value (for example, 0), but errors of another value (for example, 1) may exist. Such an inaccurate LLR value may increase an error flow with respect to LDPC decoding.

A channel decoding method according to an embodiment focuses on a fact that a bit value pre-defined for a certain bit is known in advance. According to one or more embodiments, an LLR value may be selectively changed so as to increase "certainty" of the LLR value corresponding to pre-defined bits.

For example, zero padding information about zero bits added during encoding is determined. Also, a portion of a bitstream corresponding to the zero bits is pre-determined according to the zero padding information, during decoding. Accordingly, by selectively changing a certain LLR value according to the zero padding information, an error flow with respect to LDPC decoding may be reduced.

According to an embodiment, an LLR value having a fixed value may be input to the variable nodes 920 according to zero padding information included in a preamble. Referring to FIG. 9, at least one LLR value corresponding to pre-defined bits of a bitstream may be changed to a pre-set value 950. In other words, according to an embodiment, LLR values changed to the pre-set values 950 may be used as inputs of the variable nodes 920, instead of LLR values generated by demodulating a channel-encoded signal. For example, when a bit at a certain position of a bitstream is pre-defined to a certain value, a fixed value (for example, a high LLR value) may be enforced with respect to an LLR corresponding to the certain position.

According to an embodiment, an LLR corresponding to a pre-defined bit may be processed as having a fixed value (for example, a largest LLR value or an infinite LLR value), and the value thereof is prevented from being changed during the decoding. A largest or infinite LLR value at a position of a pre-defined bit enhances "certainty" of a bit value during decoding, thereby guaranteeing accuracy of the decoding.

Figure 10:
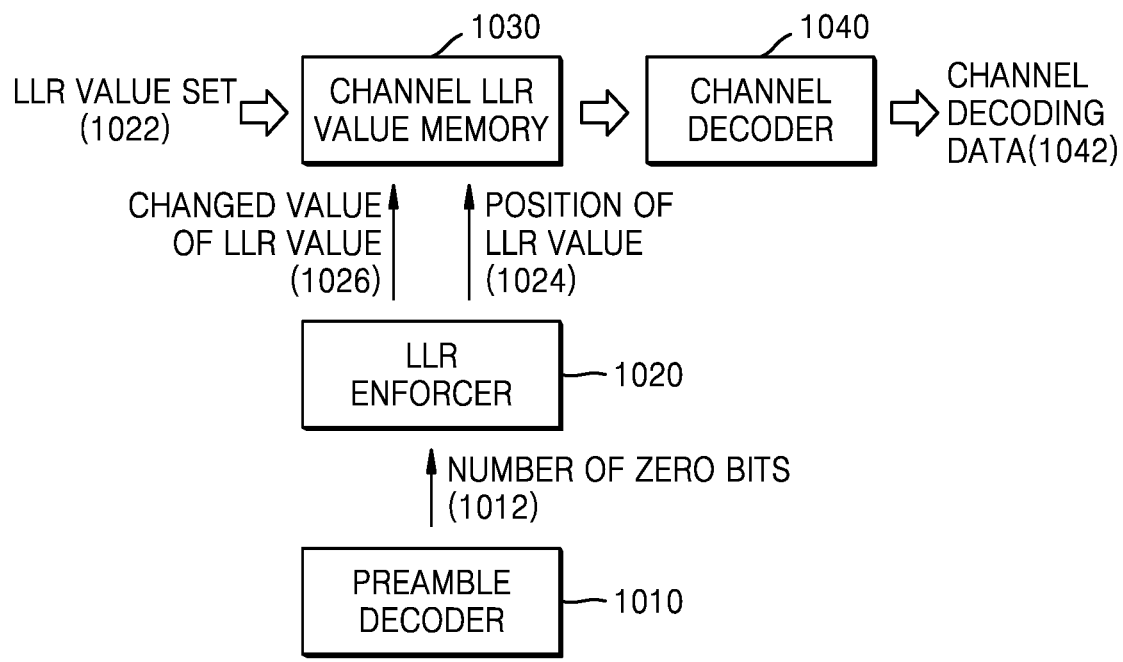
FIG. 10 is a flow diagram for describing a method of performing channel decoding by using zero padding information of a preamble according to an embodiment.

FIG. 10 is a flow diagram for describing a method of performing channel decoding by using zero padding information included in a preamble.

A preamble decoder 1010 determines the number 1012 of zero bits included in a bitstream by decoding zero padding information included in a preamble. Also, an LLR enforcer 1020 determines a position 1024 or an LLR value to be changed and a changed value 1026 of the LLR value, from an LLR value set 1022 obtained from a modulator, according to the number 1012 of zero bits determined by the preamble decoder 1010. Since positions of the zero bits in the bitstream is pre-determined, the LLR enforcer 1020 may determine the positions of the zero bits only by using the number 1012 of the zero bits included in the bitstream.

The LLR enforcer 1020 may change the LLR value set 1022 stored in a channel LLR value memory 1030. For example, the LLR enforcer 1020 may determine the position 1024 of the LLR value to be changed from the LLR value set 1022, and then change the LLR value to a certain value. For example, the LLR value may be a smallest or largest value. Also, a channel decoder 1040 may perform a parity check according to a changed LLR value set of the channel LLR value memory 1030. The channel decoder 1040 may output channel decoding data 1042 according to a result of the parity check.

According to the current embodiment, by enforcing a certain value to an LLR value corresponding to consecutive zero bits, a throughput required for a parity check may be reduced. Accordingly, overall efficiency of a broadcast signal transmitting apparatus may increase.

Figure 11:
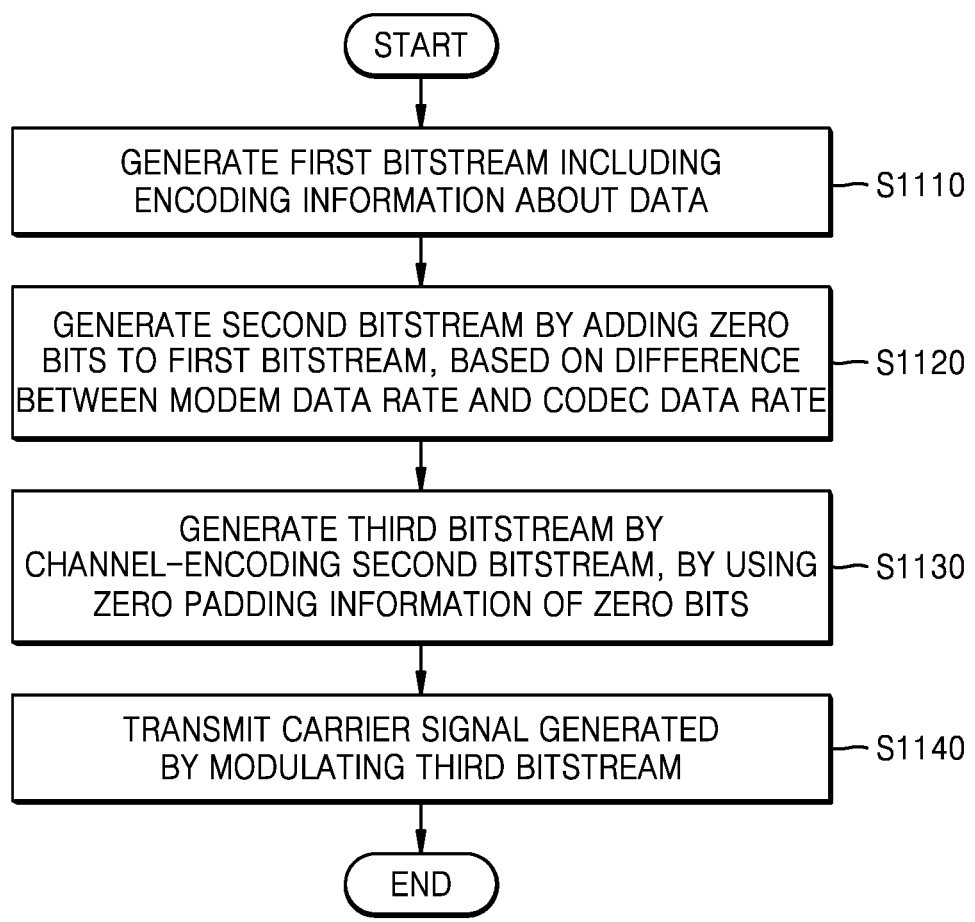
FIG. 11 is a flowchart of a data transmitting method of a broadcast signal transmitting apparatus using zero padding information according to an embodiment.

FIG. 11 is a flowchart of a data transmitting method of a broadcast signal transmitting apparatus using zero padding information.

In operation S1110, a first bitstream including encoded data is generated.

In operation S1120, a second bitstream is generated by adding zero bits to the first bitstream, based on a difference between a modem data rate and a codec data rate.

The zero bits may be added uniformly to a plurality of codewords included in the first bitstream, wherein the number of plurality of codewords is determined according to at least one of the number of frames per certain time and the number of channel encoders.

A portion of the second bitstream, which corresponds to the encoded data, may be scrambled by using a first scrambler, and a portion of the second bitstream, which corresponds to the zero bits, may be scrambled by using a second scrambler.

In operation S1130, a third bitstream is generated by channel-encoding the second bitstream, by using zero padding information of the zero bits. The zero padding information includes information about the number of zero bits. The zero padding information may be encoded and added to a preamble of the second bitstream.

The third bitstream may further include a LDPC code for correcting an error according to transmission of bits included in the second bitstream.

In operation S1140, a carrier signal generated by modulating the third bitstream is transmitted.

Figure 12:
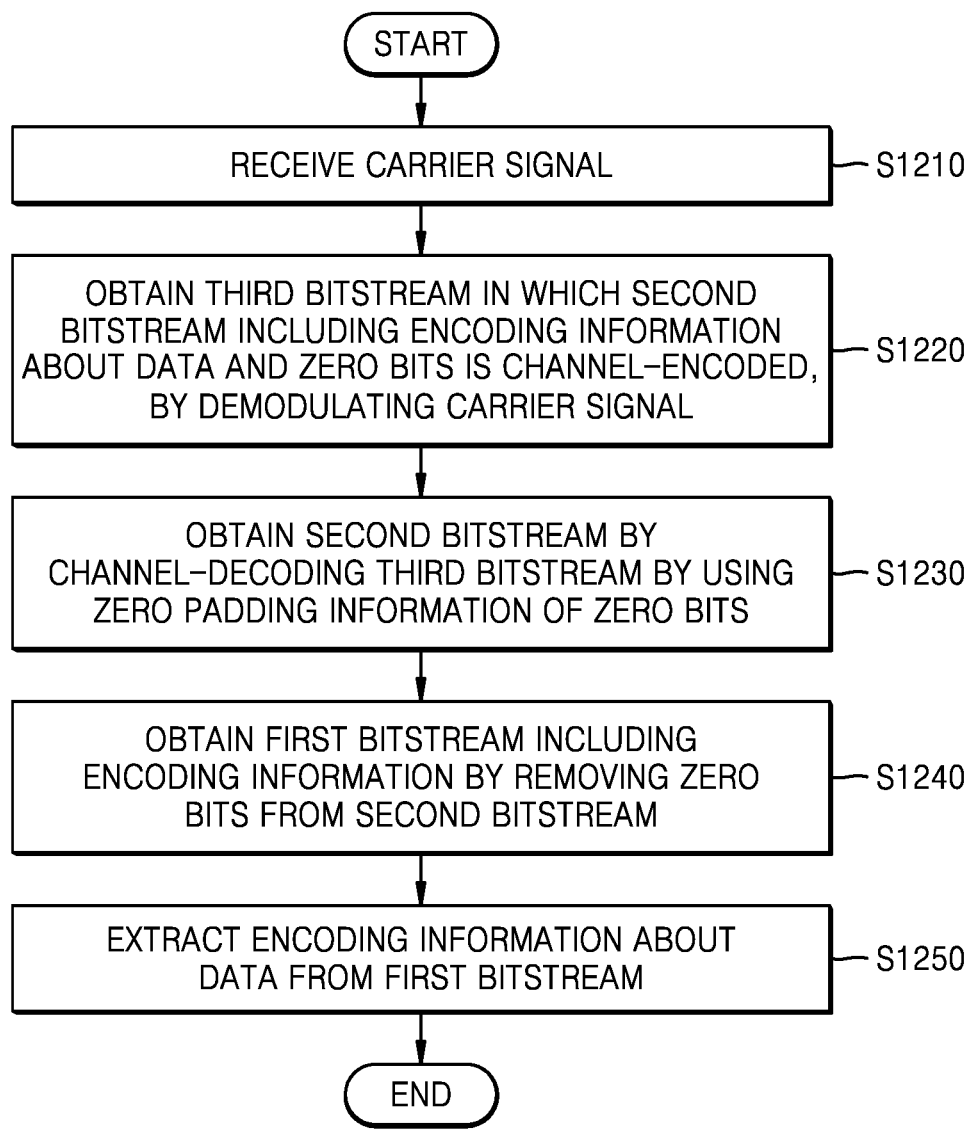
FIG. 12 is a flowchart of a data receiving method of a broadcast signal receiving apparatus using zero padding information according to an embodiment.

FIG. 12 is a flowchart of a data receiving method of a broadcast signal receiving apparatus using zero padding information.

In operation S1210, a carrier signal is received.

In operation S1220, a third bitstream is obtained by demodulating the carrier signal. The third bitstream may be generated when a second bitstream including encoded data and zero bits is channel-encoded during encoding.

In operation S1230, the second bitstream is obtained by channel-decoding the third bitstream by using zero padding information about the zero bits.

The zero padding information included in a preamble of the third bitstream is decoded. The second bitstream is obtained by channel-decoding the third bitstream according to the decoded zero padding information.

A parity check may be performed on the third bitstream by using an LDPC code for correcting an error according to transmission of the carrier signal. When an error is found in the third bitstream according to a result of the parity check, the error may be corrected.

The parity check may be performed by generating a first LLR value set from the demodulated carrier signal, determining LLR information including an LLR enforced value and an LLR position from the zero padding information, generating a second LLR value set by changing at least one LLR value included in the first LLR value set, according to the LLR information, and performing the parity check according to an LDPC code and variable nodes determined according to the second LLR value set.

A portion of the second bitstream, which corresponds to the encoded data, may be descrambled by using a first descrambler, and a portion of the second bitstream, which corresponds to the zero bits, may be descrambled by using a second descrambler.

In operation S1240, a first bitstream including the encoded data is obtained by removing the zero bits from the second bitstream.

In operation S1250, the encoding information about the data is extracted from the first bitstream.

An embodiment of the present disclosure may also be realized in a form of a non-transitory computer-readable recording medium, such as a program module executed by a computer. A non-transitory computer-readable recording medium may be an arbitrary available medium accessible by a computer, and examples thereof include all volatile and non-volatile media and separable and non-separable media. Further, examples of the non-transitory computer-readable recording medium may include a computer storage medium and a communication medium. Examples of the computer storage medium include all volatile and non-volatile media and separable and non-separable media, which have been implemented by an arbitrary method or technology, for storing information such as computer-readable instructions, data structures, program modules, and other data. The communication medium typically include a computer-readable instruction, a data structure, a program module, other data of a modulated data signal, or another transmission mechanism, and an example thereof includes an arbitrary information transmission medium. Also, some embodiments may be realized in a computer program or a computer program product including instructions executable by a computer.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A broadcast signal transmitting method comprising:
generating a first bitstream comprising encoded data;
generating a second bitstream by adding zero bits to the first bitstream, based on a difference between a modem data rate and a codec data rate, wherein the second bitstream comprises the added zero bits and the first bitstream;
generating a scrambled second bitstream by:
scrambling, by a first scrambler, the encoded data of the second bitstream; and
scrambling, by a second scrambler different from the first scrambler, the added zero bits of the second bitstream separately from the encoded data of the second bit stream;
generating a third bitstream by encoding the scrambled second bitstream by using zero padding information about the added zero bits; and
transmitting a carrier signal generated by modulating the third bitstream.

2. The broadcast signal transmitting method of claim 1, wherein the zero bits are uniformly added to a plurality of sub-bitstreams included in the first bitstream, and
wherein a number of the plurality of sub-bitstreams is determined according to at least one of
a number of frames per certain time and
a number of channel encoders.

3. The broadcast signal transmitting method of claim 1, wherein the zero bits are added to a plurality of sub-bitstreams, which are included in the first bitstream and respectively comprise pieces of the encoded data having different sizes, such that the plurality of sub-bitstreams have the same size after the zero bits are added thereto.

4. The broadcast signal transmitting method of claim 1, further comprising:
encoding the zero padding information; and
adding the encoded zero padding information to a preamble of the scrambled second bitstream,
wherein the zero padding information comprises information about a number of the zero bits.

5. The broadcast signal transmitting method of claim 1, wherein the generating the third bitstream comprises adding, to the scrambled second bitstream, a low density parity check (LDPC) code for correcting an error according to transmission of bits included in the scrambled second bitstream.

6. The broadcast signal transmitting method of claim 1, wherein the generating the first bitstream comprises:
determining an encoding rate of data to be encoded such that the codec data rate is equal to or lower than the modem data rate; and
encoding the data to generate the first bitstream based on the determined encoding rate.

7. A non-transitory computer-readable recording medium having recorded thereon a program which, when executed by a computer, performs the broadcast signal transmitting method of claim 1.

8. A broadcast signal transmitting apparatus comprising at least one processor configured to implement:
a first data encoder configured to generate a first bitstream comprising encoded data;
a zero bit padder configured to generate a second bitstream by adding zero bits to the first bitstream, based on a difference between a modem data rate and a codec data rate wherein the second bitstream comprises the added zero bits and the first bitstream;
a first scrambler configured to scramble the encoded data of the second bitstream and output the scrambled encoded data of the second bit stream;
a second scrambler different from the first scrambler, wherein the second scrambler is configured to scramble the added zero bits of the second bitstream, separately from the encoded data of the second bit stream and configured to output the scrambled added zero bits of the second bitstream;
a second data encoder configured to generate a scrambled second bitstream using the scrambled encoded data of the second bitstream outputted from the first scrambler and the scrambled added zero bits of the second bitstream outputted by the second scrambler;
a channel encoder configured to channel-encode the scrambled second bitstream by using zero padding information about the zero bits to generate a third bitstream; and
a modulator configured to transmit a carrier signal generated by modulating the third bitstream.

9. The broadcast signal transmitting apparatus of claim 8, wherein the zero bit padder adds the zero bits to the first bitstream such that an equal number of zero bits are added to each sub-bitstream of a plurality of sub-bitstreams included in the first bitstream.

10. The broadcast signal transmitting apparatus of claim 8, wherein the zero bit padder adds the zero bits to a plurality of sub-bitstreams, which are included in the first bitstream and respectively comprise pieces of the encoded data having different sizes, such that the plurality of sub-bitstreams have the same size after the zero bits are added thereto.

11. The broadcast signal transmitting apparatus of claim 8, wherein the first data encoder determines an encoding rate of data to be encoded such that the codec data rate is equal to or lower than the modem data rate, and encodes the data to generate the first bitstream based on the determined encoding rate.

* * * * *